(12) United States Patent
Pacala et al.

(10) Patent No.: US 10,557,750 B2
(45) Date of Patent: Feb. 11, 2020

(54) SYSTEMS AND METHODS FOR CALIBRATING AN OPTICAL DISTANCE SENSOR

(71) Applicant: Ouster, Inc., San Francisco, CA (US)

(72) Inventors: Angus Pacala, San Francisco, CA (US); Mark Frichtl, San Francisco, CA (US)

(73) Assignee: OUSTER, INC., San Francisco, CA (US)

( * ) Notice: Subject to any disclaimer, the term of this patent is extended or adjusted under 35 U.S.C. 154(b) by 0 days.

(21) Appl. No.: 15/934,338

(22) Filed: Mar. 23, 2018

(65) Prior Publication Data

US 2018/0209841 A1 Jul. 26, 2018

Related U.S. Application Data

(63) Continuation of application No. 15/419,053, filed on Jan. 30, 2017, now Pat. No. 9,989,406.

(Continued)

(51) Int. Cl.
*G01J 1/02* (2006.01)
*G01J 1/08* (2006.01)
*G01J 1/44* (2006.01)

(52) U.S. Cl.
CPC ........... *G01J 1/0295* (2013.01); *G01J 1/0252* (2013.01); *G01J 1/08* (2013.01); *G01J 1/44* (2013.01);
(Continued)

(58) Field of Classification Search
CPC .......... G01J 1/0295; G01J 1/0252; G01J 1/08; G01J 1/44; G01J 2001/086;
(Continued)

(56) References Cited

U.S. PATENT DOCUMENTS 4,702,600 A 10/1987 Handrich et al.
4,744,667 A 5/1988 Fay et al.
(Continued)

FOREIGN PATENT DOCUMENTS

WO 2015163074 10/2015
WO 2015136100 9/2017

OTHER PUBLICATIONS

Davide Contini et al. "Time-domain diffuse optics: towards next generation devices", Proc. SPIE 9538, Diffuse Optical Imaging V, 95380A (Jul. 10, 2015) (Year: 2015).*

(Continued)

*Primary Examiner* — Hina F Ayub
(74) *Attorney, Agent, or Firm* — Kilpatrick Townsend & Stockton LLP

(57) ABSTRACT

A calibration system is provided including an aperture layer, a lens layer, an optical filter, a pixel layer and a regulator. The aperture layer defines a calibration aperture. The lens layer includes a calibration lens substantially axially aligned with the calibration aperture. The optical filter is adjacent the lens layer opposite the aperture layer. The pixel layer is adjacent the optical filter opposite the lens layer and includes a calibration pixel substantially axially aligned with the calibration lens. The calibration pixel detects light power of an illumination source that outputs a band of wavelengths of light as a function of a parameter. The regulator modifies the parameter of the illumination source based on a light power detected by the calibration pixel.

27 Claims, 5 Drawing Sheets

Related U.S. Application Data

(60) Provisional application No. 62/289,004, filed on Jan. 29, 2016.

(52) U.S. Cl.
CPC ... *G01J 2001/086* (2013.01); *G01J 2001/442* (2013.01); *G01J 2001/444* (2013.01)

(58) Field of Classification Search
CPC .......... G01J 2001/442; G01J 2001/444; G01B 11/026; G01B 11/24; G01S 7/481; G01S 7/497; G01S 17/42; G01S 17/89; G01S 17/4815; H01L 27/146
USPC .......................................................... 356/3
See application file for complete search history.

(56) References Cited

U.S. PATENT DOCUMENTS

| | | |
|---|---|---|
| 5,188,286 A | 2/1993 | Pence, IV |
| 5,268,748 A | 12/1993 | Van Hijningen et al. |
| 6,043,873 A * | 3/2000 | Ramer ...................... G01S 5/16 356/139.03 |
| 6,104,516 A | 8/2000 | Majima |
| 7,091,462 B2 | 8/2006 | Wilson et al. |
| 7,683,962 B2 | 3/2010 | Border et al. |
| 7,876,456 B2 | 1/2011 | Sesko |
| 8,836,922 B1 | 9/2014 | Pennecot et al. |
| 9,330,464 B1 * | 5/2016 | Ackerman .............. G01S 17/89 |
| 9,989,406 B2 | 6/2018 | Pacala et al. |
| 9,992,477 B2 | 6/2018 | Pacala |
| 10,063,849 B2 | 8/2018 | Pacala |
| 2005/0046850 A1 | 3/2005 | Chow |
| 2007/0060806 A1 | 3/2007 | Hunter et al. |
| 2013/0229646 A1 | 9/2013 | Sakurai |
| 2015/0124094 A1 | 5/2015 | Loong et al. |
| 2015/0260830 A1 | 9/2015 | Ghosh et al. |
| 2015/0316473 A1 | 11/2015 | Kester et al. |
| 2016/0218727 A1 | 7/2016 | Maki |
| 2017/0303829 A1 | 10/2017 | Cohen et al. |
| 2018/0038959 A1 * | 2/2018 | Akatsu .............. H05B 37/0227 |
| 2018/0152691 A1 | 5/2018 | Pacala |

OTHER PUBLICATIONS

Seong-Seok Yanget al. "Wavelength Tuning of Vertical-Cavity Surface-Emitting Lasers by an Internal Device Heater", IEEE Photonics Tech. Letters, V. 20, No. 20, Oct. 15, 2008 (Year: 2008).*
U.S. Appl. No. 15/419,053 , "Non-Final Office Action", dated Jul. 28, 2017, 18 pages.
U.S. Appl. No. 15/419,053 , "Notice of Allowance", dated Jan. 26, 2018, 12 pages.
PCT/US2017/015683 , "International Search Report and Written Opinion", dated Apr. 17, 2017, 12 pages.
EP17745102.8 , "Extended European Search Report", dated Sep. 9, 2019, 6 pages.

* cited by examiner

Optical Filter $\lambda_{nom}$: 829 nm
$d_0$: ~0 μm
$d_1$: +10 μm
$d_2$: +20 μm
$d_3$: +30 μm

| Laser Temperature | Laser Output λ (nm) | Incident Photon Count (% of maximum) | | | | |
|---|---|---|---|---|---|---|
| | | Calibration Circuit 1 ($d_0 = 0°$) | Calibration Circuit 2 ($d_1 = 1°$) | Calibration Circuit 3 ($d_2 = 2°$) | Calibration Circuit 4 ($d_3 = 3°$) | increase TR power ↑ |
| T1 | 827 | 40 | 60 | 100 | 30 | |
| T2 | 828 | 90 | 100 | 30 | 0 | |
| T3 (target) | 829 | 100 | 90 | 30 | 5 | |
| T4 | 830 | 50 | 45 | 15 | 0 | |
| T5 | 831 | 10 | 5 | 0 | 0 | ↓ decrease TR power |

FIG. 2C

Optical Filter $\lambda_{nom}$: 829 nm
$d_0$: -10 μm
$d_1$: ~0 μm
$d_2$: +10 μm
$d_3$: +20 μm

| Laser Temperature | Laser Output λ (nm) | Incident Photon Count (% of maximum) | | | | |
|---|---|---|---|---|---|---|
| | | Calibration Circuit 1 ($d_0 = -1°$) | Calibration Circuit 2 ($d_1 = 0°$) | Calibration Circuit 3 ($d_2 = 1°$) | Calibration Circuit 4 ($d_3 = 2°$) | increase TR power ↑ |
| T0 | 826 | 15 | 5 | 15 | 60 | |
| T1 | 827 | 70 | 45 | 70 | 100 | |
| T2 (target) | 828 | 100 | 90 | 100 | 45 | |
| T3 | 829 | 90 | 100 | 90 | 15 | |
| T4 | 830 | 45 | 50 | 45 | 0 | ↓ decrease TR power |

FIG. 2D

SYSTEMS AND METHODS FOR CALIBRATING AN OPTICAL DISTANCE SENSOR

CROSS-REFERENCE TO RELATED APPLICATIONS

This application is a continuation of U.S. patent application Ser. No. 15/419,053 filed Jan. 30, 2017, which claims the benefit of U.S. Provisional Patent Application No. 62/289,004 filed Jan. 29, 2016, the disclosures of each of which are hereby incorporated by reference in their entirety.

TECHNICAL FIELD

This disclosure relates generally to the field of optical sensors and more specifically to a new and useful system and method for calibrating an optical distance sensor in the field of optical sensors.

BRIEF DESCRIPTION OF THE FIGURES

FIGS. 2B, 2C, and 2D are graphical representations of the second embodiment herein;

DESCRIPTION OF THE EMBODIMENTS

The following description of embodiments of the invention is not intended to limit the invention to these embodiments but rather to enable a person skilled in the art to make and use this invention. Variations, configurations, implementations, example implementations, and examples described herein are optional and are not exclusive to the variations, configurations, implementations, example implementations, and examples they describe. The invention described herein can include any and all permutations of these variations, configurations, implementations, example implementations, and examples.

1. System

Figure 1:
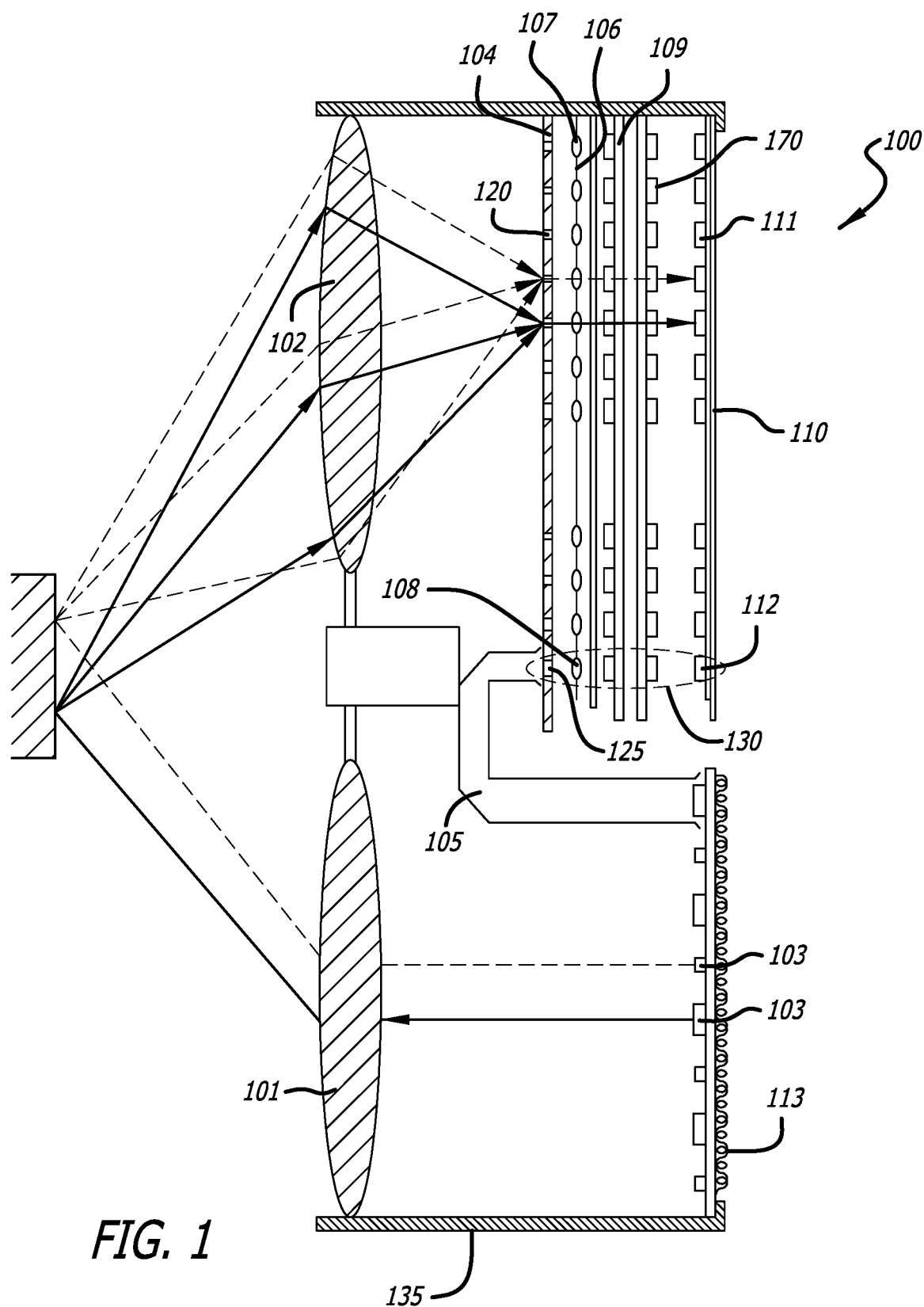
FIG. 1 is a schematic representation of a system according to a first embodiment herein.

As shown in FIG. 1, in one embodiment, a calibration system 100 (e.g., for calibrating an optical distance sensor) includes: a bulk transmitting optic 101 and a bulk receiving optic 102. The system 100 may also include an illumination source 103 offset behind the bulk transmitting optic and configured to output a wavelength of light as a function of temperature; an aperture layer 104 arranged behind the bulk receiving optic and defining a sense aperture 120 and a calibration aperture 125; an optical bypass 105 extending from the illumination source behind the bulk transmitting optic to the calibration aperture; a lens layer 106 adjacent the aperture layer opposite the bulk receiving optic, comprising a sense lens 107 substantially axially aligned with the sense aperture, and comprising a calibration lens 108 substantially axially aligned with the calibration aperture; an optical filter 109 adjacent the lens layer opposite the aperture layer; a pixel layer 110 adjacent the optical filter opposite the lens layer, comprising a sense pixel 111 substantially axially aligned with the sense lens, and comprising a calibration pixel 112 substantially axially aligned with the calibration lens; and a temperature regulator 113 coupled to the illumination source and configured to modify a temperature of the illumination source based on a light power detected by the calibration pixel. In the embodiment of FIG. 1, system 100 may also include diffuser 170 configured to guide light onto the photodetectors. In one embodiment, the diffuser may be included in an optional converging lens layer arranged so as to converge light onto the photodetectors. The converging lens layer may be arranged between the optical filter and the photodetector. The converging lens layer may also comprise a micro-lens, a plurality of micro-lenses, a diffuser, or any other element capable of guiding light onto the photodetectors. In addition, in the embodiment of FIG. 1, system 100 may be housed in a housing 135. Although various layers have been described in the foregoing embodiment as being adjacent to another layer, it will be appreciated that fewer or additional layers may be included. For example, it will be understood that additional aperture layers may be included between any two layers.

Figures 3A, 3B:
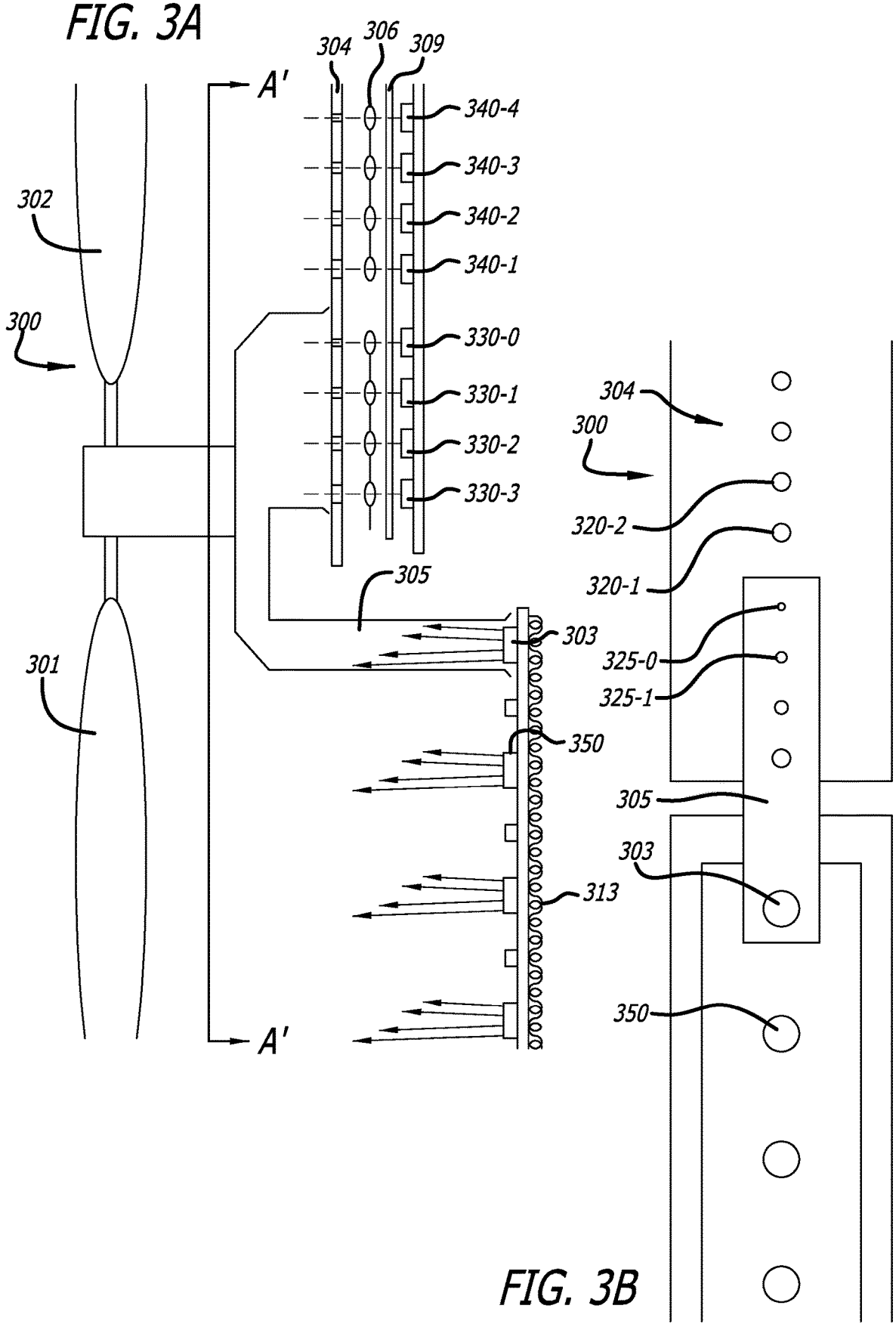
FIGS. 3A and 3B are schematic representations according to a third embodiment herein.

As shown in FIG. 3A, system 300 is an embodiment of a variation of the system 100, where the system 300 may include: a bulk transmitting optic 301; a bulk receiving optic 302; an illumination source offset behind the bulk transmitting optic and configured to output a wavelength of light as a function of temperature; an aperture layer 304 defining a first calibration aperture and a second calibration aperture; an optical bypass 305 extending from the illumination source behind the bulk transmitting optic to the first calibration aperture and the second calibration aperture; a lens layer 306 adjacent the aperture layer opposite the optical bypass, comprising a first calibration lens substantially axially aligned with the first calibration aperture, and comprising a second calibration lens axially offset from the second calibration aperture; an optical filter 309 adjacent the lens layer opposite the aperture layer; a pixel layer adjacent the optical filter opposite the lens layer, comprising a first calibration pixel substantially axially aligned with the first calibration lens, and comprising a second calibration pixel aligned with a ray extending through the second aperture and the second calibration lens; and a temperature regulator 313 coupled to the illumination source and configured to modify a temperature of the illumination source based on a light power detected by the first calibration pixel and the second calibration pixel. System 300 also may include a second illumination source 350, in addition to illumination source 303.

2. Applications

In one embodiment, the system 100 functions as an image sensor that, when rotated about an axis parallel to a column of sense apertures, collects three-dimensional distance data of a volume occupied by the system 100. Similarly, the system 100 can function as a static image sensor that collects two- or three-dimensional distance data of a space or volume in the field of view of the system 100. Generally, the system 100 can scan a volume to collect three-dimensional distance data that can then be reconstructed into a virtual three-dimensional representation of the volume, such as based on recorded times between transmission of an illuminating beam from the illumination source and detection of photons—likely originating from the illumination source—incident on the sense pixel, based on phase-based measurement techniques, or based on another distance measurement technique.

In one embodiment, the system 100 includes an illumination source, a calibration circuit 130, and a sensing circuit. The sensing circuit includes a sense aperture, a sense lens, and an optical filter that cooperate to pass only a relatively narrow band of wavelengths of light (e.g., a single target wavelength +/−0.25 nanometers) to a corresponding sense pixel. Because the sensing circuit is configured to detect light in only a relatively narrow wavelength band, the system 100 can tune the illumination source to output light within this relatively narrow wavelength band. The illumination source can output a narrow band of wavelengths of light in a distribution pattern centered at a wavelength. The center frequency of the light source can be varied by changing the temperature of the illumination source (the preferred mode), though alternately it can be done by changing the duty cycle of the source, by using piezo effect, or any other means available. The calibration circuit can actively control the source temperature by a regulator—thermally coupled to the illumination source—in order to govern the center wavelength of light output by the illumination source. In particular, the calibration circuit can match the center wavelength of light output by the illumination source to the center wavelength passed and detected by the sensing circuit in order to substantially maximize the energy efficiency of any receiver system such as the system 100 (i.e., a ratio of light read by the sensing circuit to light output by the illumination source).

The optical filter in the sensing circuit may pass and reject light as a function of incident angle, and manufacturing defects may yield a lateral and/or longitudinal offset between the aperture layer and the lens layer such that the sense aperture and the sense lens are not axially aligned and such that light output from the sense lens reaches the optical filter at an angle other than perpendicular to the optical filter. Misalignment between the aperture layer and the lens layer during manufacture may therefore yield a sensing circuit that passes and detects a center wavelength of light other than a nominal wavelength that the optical filter is configured to pass (i.e., a center wavelength that the optical filter passes for light incident on the optical filter at) 90°, as shown in FIG. 2B. Furthermore, such misalignment between aperture layers and lens layers may not be uniform from one unit of the system 100 to the next and may vary over time within a single unit of the system 100, such as due to ambient temperature and/or pressure. Similarly, illumination sources (e.g., bar diode lasers) may exhibit different output characteristics (e.g., variations in center or primary output wavelength at a particular operating temperature), even within a single batch of illumination sources, due to manufacturing defects.

Therefore, rather than implement an illumination source-specific center output wavelength versus temperature model and an empirically-determined target center wavelength for the aperture layer and lens layer stack, the system 100 can incorporate a calibration circuit—similar to the sensing circuit—and can actively modify an output of the temperature regulator based on light detected by the calibration circuit. In particular, the calibration circuit: can include a calibration aperture integrated in the same aperture layer as the sense aperture; can include a calibration lens integrated into the same lens layer as the sense lens; can share the optical filter (e.g., an optical filter layer) with the sensing circuit; and can include a calibration pixel integrated into the same pixel layer as the sensing circuit. The calibration circuit can therefore mimic manufacturing defects occurring in the sensing circuit such that tuning the illumination source to achieve peak incident light through the calibration circuit similarly tunes the illumination source to the sensing circuit. In particular, a unit of the system 100 can actively manipulate the temperature regulator to maintain peak incident photon count per unit time at the calibration pixel through-out operation, thereby matching the output of the illumination optic to both the calibration circuit and the sensing circuit and automatically compensating for substantially unique stacks of manufacturing defects in the unit of the system 100 with a closed-loop feedback model common to a mass of units of the system 100.

Generally, peak incident photon count recorded by the calibration pixel may occur when the output wavelength of the illumination source is matched to the bulk peak-power wavelength of the calibration circuit. The calibration circuit and the sensing circuit share a common optical filter, include apertures defined by a common aperture layer, include lenses in a common lens layer, and are subject to common lateral and longitudinal offsets between apertures and lenses. Therefore, the bulk peak-power wavelength of the sensing circuit is substantially identical to the bulk peak-power wavelength of the calibration circuit. In order to increase (or substantially maximize) efficiency of the system 100 during operation, the system 100 can uniquely calibrate the illumination source to the sensing circuit by tuning the output wavelength of the illumination source to achieve a peak incident photon count per unit time at the calibration pixel. For example, the illumination source can output light at a center wavelength that varies proportionally with the temperature of the illumination source, and the system 100 can control the center output wavelength of the illumination source by actively manipulating heat flux of the temperature regulator coupled to the illumination source. Throughout operation, the system 100 can implement closed-loop feedback techniques to actively control the output of the temperature regulator—and therefore the center output wavelength of the illumination source—based on incident photon counts read from the calibration pixel such that the illumination source remains tuned to the sensing circuit over time despite changes in internal temperature, ambient temperature, ambient pressure, etc.

Figure 2A:
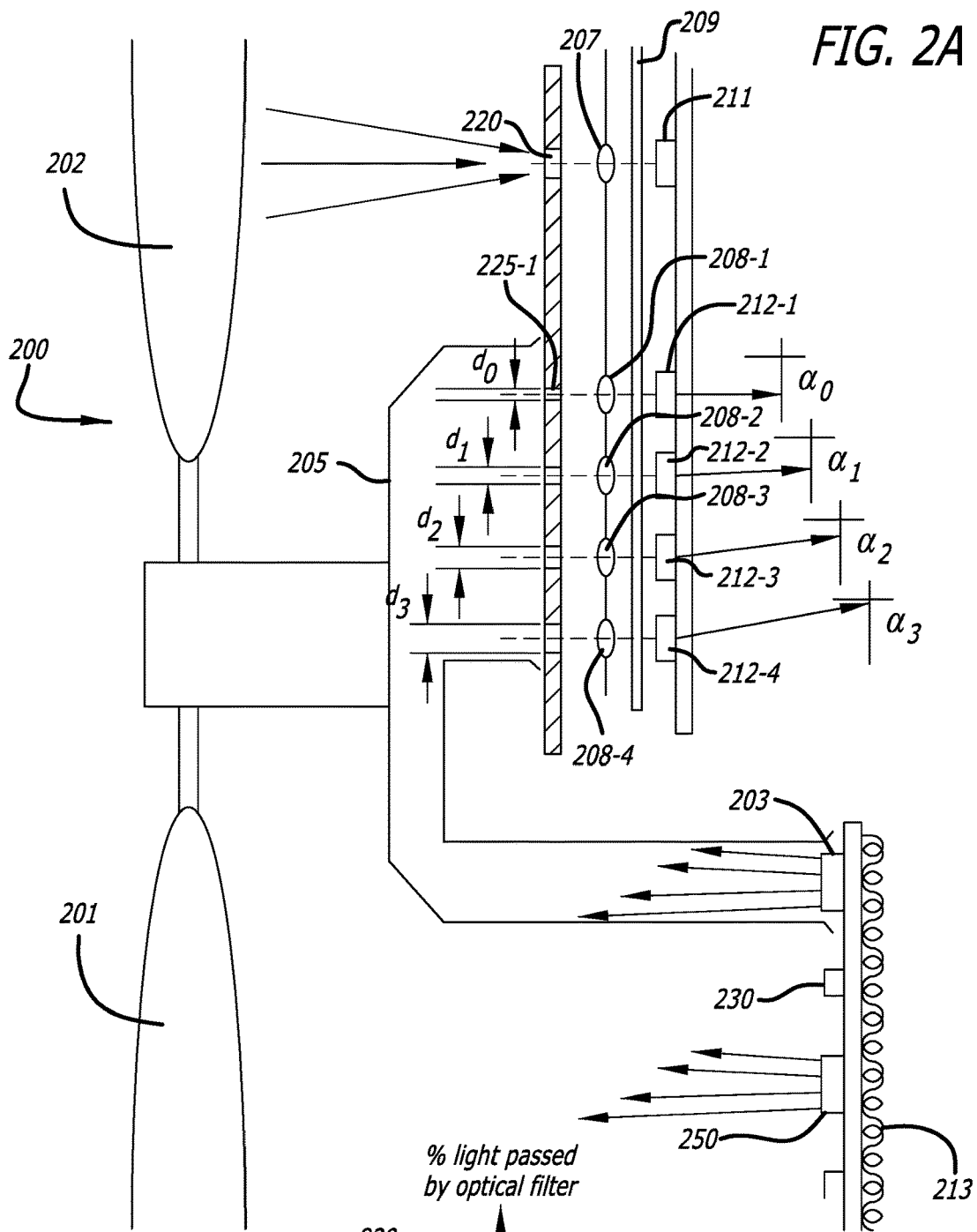
FIG. 2A is a schematic representation according to a second embodiment herein.
Figure 2B:
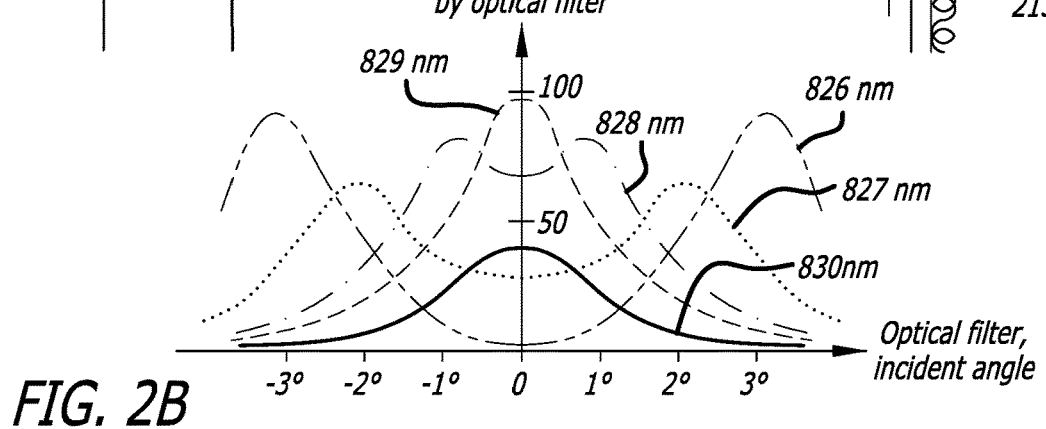

As shown in FIG. 2A, in one embodiment, a system 200 can include multiple calibration circuits. The system 200 may include a bulk transmitting optic 201, a bulk receiving optic 202, an optical filter 209, a sense aperture 220, a sense lens 207, a sense pixel 211, illumination sources 203 and 250, and an optical bypass 205. These components may be structured similarly to the components described above in connection with FIG. 1. In this variation, each calibration aperture and calibration lens (e.g., calibration apertures 225 and calibration lenses 208, or individually as calibration apertures 225-1, 225-2, 225-3, 225-4 and calibration lenses 208-1, 208-2, 208-3, 208-4) can be offset by a unique distance (e.g., distance $d_0$, $d_1$, $d_2$, $d_3$, etc.) in the set such that the calibration lens outputs light toward the optical filter at a unique nominal angle (e.g., angle $\alpha_0$, $\alpha_1$, $\alpha_2$, $\alpha_3$, etc.) in the set. For example, the system 100 can include a first calibration aperture and lens set, a second calibration aperture and lens set, a third calibration aperture and lens set, and a fourth calibration aperture and lens set assembled at unique offset distances such that the first, second, third, and fourth calibration lens output light toward the optical filter at 0°, 1°, 2°, and 3° to the optical filter, respectively, as shown in FIGS. 2A and 2C. Thus, in one embodiment, calibration apertures can be offset from the calibration lenses. Of course, in other embodiments, any number of calibration circuits (e.g., set of calibration aperture, lens, pixel) may be included in the system. In this variation, the system 200 can read incident photon counts (or times between consecutive incident photons, etc.) from each of calibration pixels 212 (individually calibration pixels 212-1, 212-2, 212-3, 212-4) during a sampling period, determine if the center output wavelength of the illumination source is greater than or less than the center wavelength read by the calibration circuit (and therefore read by the sensing circuit) during the sampling period based on this set of incident photon counts, and then increase or decrease the temperature of the illumination source—via the temperature regulator—accordingly to improve alignment of center wavelengths output by the illumination source and read by the calibration circuit.

3. Sensing Circuit

Figure 4:
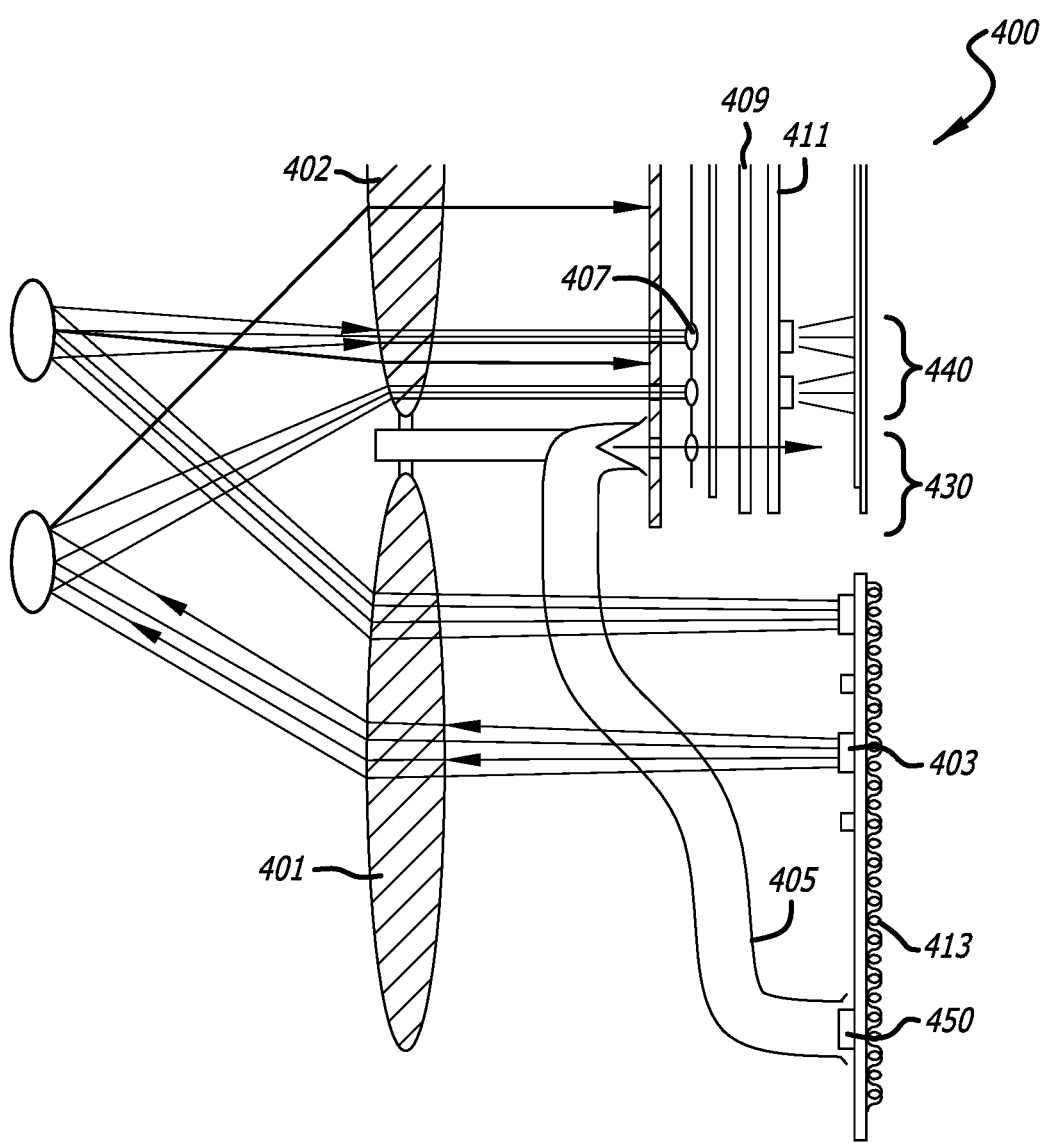
FIG. 4 is a schematic representation according to a fourth embodiment herein.

As shown in FIGS. 1 and 4, in some embodiments, the sensing circuit of the system 100 (and system 400) may include: a bulk receiving optic (e.g., 102 and 402); an aperture layer arranged behind the bulk receiving optic and defining a sense aperture and a calibration aperture; a lens layer (e.g., 107 and 407) adjacent the aperture layer opposite the bulk receiving optic and defining a sense lens substantially axially aligned with the sense aperture; an optical filter (e.g., 109 and 409) adjacent the lens layer opposite the aperture layer; and a pixel layer (e.g., 111 and 411) adjacent the optical filter opposite the lens layer and including a sense pixel substantially axially aligned with the sense lens. Generally, the bulk receiving optic, sense aperture, sense lens, optical filter, and the sense pixel cooperate to collect light (e.g., ambient light and light output by the illumination source), to collimate light, to reject all light outside of a narrow band of wavelengths including a center output wavelength of the illumination source, and to detect light reaching the sense pixel. The system 100 (e.g., a processor within the system 100) can thus transform an incident photon count, a time between incident photons, an incident photon time relative to an illumination beam output time, etc. into a position of a surface in a field of view of the sensing circuit. As shown in FIG. 4, similar to system 100, system 400 may also include bulk transmitting optic 401, illumination sources 403 and 450, optical bypass 405, regulator 413 and calibration circuit 430. These components may be structured similarly to those described in connection with system 100 of FIG. 1. As also shown in FIG. 4, system 400 may include an aperture pitch distance 440.

In one implementation, the bulk receiving optic functions to project incident light rays from outside the system 100 toward a focal plane within the system 100. For example, the bulk receiving optic can define a converging lens and can include multiple lenses, such as one or more bi-convex lenses (shown in FIGS. 1 and 4) and/or plano-convex lenses, that cooperate to yield a total bulk focal length at or near the center wavelength of perpendicular light rays passed by the optical filter (i.e., the nominal operating wavelength of the system 100). The aperture layer includes a relatively thin opaque structure coincident the focal plane (i.e., offset from the bulk receiving optic behind the bulk focal length) and defining the sense aperture and a stop region around the sense aperture. The stop region of the aperture layer rejects (e.g., blocks, absorbs, reflects) incident light rays, and the sense aperture passes incident light rays toward the sense lens. For example, the aperture layer can define a sense aperture of diameter approaching a diffraction-limited diameter to maximize geometrical selectivity of the field of view of the sensing circuit.

In this implementation, the sense lens is characterized by a sense focal length, is offset from the focal plane by the sense focal length, collimates lights rays passed by the sense aperture, and passes collimated light rays into the optical filter. For example, the sense lens can include a converging lens characterized by a ray cone substantially matched to a ray cone of the bulk receiving optic and can be offset from the focal plane of the bulk receiving optic by a relatively short sense focal length to preserve the aperture of the bulk receiving optic and to collimate light passed by the sense aperture. The optical filter receives collimated light—in a spectrum of wavelengths—from the sense lens, passes a relatively narrow band of wavelengths of light (e.g., the operating wavelength +/−0.25 nanometers) to the sense pixel, and blocks light outside of this narrow wavelength band. For example, the optical filter can include a narrow optical bandpass filter.

For example, the illumination source can output light (predominantly) at a nominal wavelength of 900 nm, and the optical filter can define a planar optical bandpass filter configured to pass light (incident on the optical filter at an angle of 90°) between 899.95 nm and 900.05 nm and configured to block substantially all light (incident on the optical filter at an angle of 90°) outside of this band. The sense pixel functions to receive light (i.e., "photons") passed by the optical filter, to detect these incident photons, and to output a signal corresponding to a number or rate of detected photons. For example, the sense pixel can include an array of single-photon avalanche diode detectors ("SPADs"), and the sense pixel can output a single signal or a stream of signals corresponding to the count of photons incident on the pixel within a single sampling period picoseconds, nanoseconds, microseconds, or milliseconds in duration.

In one variation, the system 300 includes multiple sensing circuits 340 (or individually 340-1, 340-2, 340-3, and 340-4), including multiple sense aperture, sense lens, and sense pixel sets, as shown in FIGS. 3A and 3B. For example, the system 300 can include: a column of offset sense apertures 320 (individually 320-1, 320-2, etc.) arranged behind the single bulk receiving optic and defining discrete (i.e., non-overlapping beyond a threshold distance from the system 100) fields of view in a field ahead of the bulk receiving optic. In one embodiment, each of sense apertures 320 are respectively aligned with a corresponding sense lens. The system 300 may also include an illumination source that projects discrete illuminating beams at an operating wavelength into the field of view defined by each sense aperture; a column of sense lenses that collimate light rays passed by corresponding sense apertures; the optical filter that spans the column of sense lenses and selectively passes a relatively narrow band of wavelengths of light; and a set of sense pixels that detect incident photons, such as by counting incident photons or recording times between consecutive incident photons. In this example, the system 100 can selectively project illuminating beams into a field ahead of the system 100 according to an illumination pattern that substantially matches—in size and geometry across a range of distances from the system 100—the fields of view of the sense apertures. In particular, the illumination source can illuminate substantially only surfaces in the field ahead of the system 100 that are within the fields of view of corresponding sense pixels such that minimal power output by the system 100 via the illumination source is wasted by illuminating surfaces in the field for which the sense pixels are blind. Therefore, the system 100 can achieve a relatively high ratio of output signal (i.e., illuminating beam power) to input signal (i.e., photons passed to an incident on the pixel array), particularly when the center output wavelength of the illumination source is matched to the center wavelength read by the sensing circuit.

In another variation, the system 100 includes a two-dimensional grid array of sensing circuits (i.e., sense aperture, sense lens, and sense pixel sets) and is configured to image a volume occupied by the system 100 in two dimensions per sampling period. In this variation, the system 100 can collect one-dimensional distance data (e.g., counts of incident photons within a sampling period and/or times between consecutive photons incident on sense pixels corresponding to known fields of view in the field) across a two-dimensional grid of sense pixels, and the system 100 can merge these one-dimensional distance data with known positions of the fields of view for each sense pixel to reconstruct a virtual three-dimensional representation of the field ahead of the system 100. For example, the aperture layer can define a 24-by-24 grid array of 200-μm-diameter sense apertures offset vertically and laterally by an aperture pitch distance of 300 μm, and the lens layer can include a 24-by-24 grid array of sense lenses offset vertically and laterally by a lens pitch distance of 300 μm. In this example, the pixel layer can include a 24-by-24 grid array of 300-μm-square sense pixels, wherein each sense pixel includes a 3×3 square array of nine 100-μm-square SPADs.

In one implementation, the bulk receiving optic, the aperture layer, the lens layer, the optical filter, and the diffuser are fabricated and then aligned with and mounted onto the pixel layer. In one example, the optical filter is fabricated by coating a fused silica substrate. Photoactive optical polymer is then deposited over the optical filter, a lens mold defining an array of lens forms placed over the photoactive optical polymer, and a UV light source activated to cure the photoactive optical polymer into a pattern of lenses across the optical filter. Standoffs are similarly molded or formed across the optical filter via photolithography techniques. The aperture layer is separately fabricated by selectively metallizing a glass wafer and etching apertures into this metallic layer; the glass wafer is then bonded or otherwise mounted to these standoffs. In this example, the assembly is subsequently inverted, and a second set of standoffs is similarly fabricated across the optical filter opposite the lens layer. The pixel layer (e.g., a discrete image sensor) is aligned with and bonded to the second set of standoffs; the bulk receiving optic is similarly mounted over the aperture layer to complete the sensing circuit stack.

Alternatively, the bulk receiving optic, the aperture layer, the lens layer, and the optical filter, can be fabricated directly onto an un-diced semiconductor wafer—containing the sense pixel—via photolithography and wafer-level bonding techniques. However, the bulk receiving optic, the aperture layer, the lens layer, the optical filter, and the pixel layer can be fabricated and assembled in any other way and with any other method or technique.

4. Output Circuit

As shown in FIG. 1, the system 100 includes an output circuit, including a bulk transmitting optic and an illumination source. In one implementation, the bulk transmitting optic: is substantially identical to the bulk receiving optic in material, geometry (e.g., focal length), thermal isolation, etc.; and is adjacent and offset laterally and/or vertically from the bulk receiving optic. In the implementation, the illumination source includes a monolithic VCSEL array of optical emitters arranged behind the bulk transmitting optic. In one example, the illumination source can include a bar diode laser defining a column of optical emitters characterized by an emitter pitch distance substantially identical to the sense aperture pitch distance; because the bar diode laser includes optical emitters fabricated on the same chip, the optical emitters can exhibit substantially similar output wavelength characteristics as a function of temperature. In this example, each optical emitter can output an illuminating beam of an initial diameter substantially identical to (or slightly greater than) the diameter of a corresponding sense aperture in the aperture layer, and the illumination source can be arranged along the focal plane of the bulk transmitting optic such that each illuminating beam projected from the bulk transmitting optic into the field intersects and is of substantially the same size and geometry as the field of view of the corresponding sensing circuit at any distance from a system 400 (e.g., a variation of the system 100), as shown in FIG. 4. Therefore, the illumination source and the bulk transmitting optic can cooperate to project substantially all output power into the fields of view of the sensing circuits with relatively minimal power wasted illuminating surfaces in space outside of the fields of view of the sensing circuits.

5. Calibration Circuit

As shown in FIG. 1, the system 100 further includes a calibration circuit, including an optical bypass 105, a calibration aperture 125 defined in the aperture layer 104, a calibration lens 108 incorporated into the lens layer 106, an optical filter 109 shared with the sensing circuit (e.g., sense aperture 120, sense lens 107, sense pixel 111), and a calibration pixel 112 incorporated into the pixel layer 110. Generally, the optical bypass 105 functions to funnel some light rays output by the illumination source 103 to the calibration aperture 125; like the sense aperture 120, sense lens 107, and optical filter 109 in the sensing circuit, the calibration aperture 125, calibration lens 108, and optical filter 109 in the calibration circuit pass a substantially narrow wavelength band of light received from the optical bypass to the calibration pixel. Based on the number of incident photons, frequency of incident photons, or incident light power, etc. detected by the calibration pixel within a sampling period, the system 100 can determine whether and/or to what extent the center (or primary) output wavelength of the illumination source 103 is matched to an effective center (or primary) operating wavelength of the calibration circuit 130, and the system 100 can modify an output of the temperature regulator accordingly to shift the output wavelength of the illumination source to the effective operating wavelength of the calibration circuit 130.

Because the calibration aperture 125, the calibration lens 108, and the calibration pixel 112 are integrated into the same aperture layer 104, lens layer 106, and pixel layer 110 as the sense aperture 120, the sense lens 107, and the sense pixel 111 and because the calibration circuit 130 and the sensing circuit (e.g., sense aperture 120, sense lens 107, sense pixel 111) share the same optical filter 109, the calibration circuit 130 can share substantially identical manufacturing defects (e.g., alignment defects) and can therefore exhibit substantially identical effective operating wavelengths. Furthermore, because the optical bypass passes some light from the same illumination source that illuminates the field of view of the sense channel, manipulation of the temperature regulator to match the output wavelength of the illumination source to the effective operating wavelength of the calibration circuit also matches the output wavelength of the illumination source to the effective operating wavelength of the sensing circuit, thereby increasing the power efficiency of the system 100.

Therefore: the calibration aperture can be formed into the aperture layer at substantially the same time and with substantially the same positional accuracy as the sense aperture; the calibration lens can be formed into the lens layer at substantially the same time and with substantially the same positional accuracy as the sense lens; and the calibration pixel can be incorporated into the pixel layer at substantially the same time and with substantially the same positional accuracy as the sense pixel, such as according to the methods and techniques described above. The optical filter can also define a singular or unitary structure that spans the calibration circuit and the sensing circuit, and the aperture layer, the lens layer, the optical filter, and the pixel layer—including both the calibration and sensing circuits—can be assembled as described above.

In one implementation, the bulk transmitting optic is arranged in plane with and laterally offset from the bulk receiving optic, and the optical bypass "siphons" light from one end of the illumination source behind the bulk transmitting optic to an adjacent region behind the bulk receiving optic and into the calibration aperture, as shown in FIGS. 1 and 4. For example, in the implementation described above in which the illumination source includes a bar diode laser with multiple optical emitters, the optical bypass can include a light pipe or an optical waveguide that extends from one end emitter on the bar diode laser and terminates over the calibration aperture behind the bulk receiving optic. However, the optical bypass can include any other structure and can function in any other way to communicate light from the illumination source into the calibration circuit.

6. Calibration

In the embodiment of FIG. 2A, the system 200 further includes a temperature regulator 213 coupled to the illumination source and configured to modify a temperature of the illumination source based on a light power detected by the calibration pixel. Generally, at startup and/or during operation, the system 200 can read a number of incident photons, a frequency of incident photons, or an incident light power, etc. detected by the calibration pixel within a sampling period and can implement closed-loop feedback control techniques to modify the output of the temperature regulator—and therefore the temperature and the center (or primary) output wavelength of the illumination source—based on the output of the calibration pixel.

In one implementation, the system 200 further includes a temperature sensor 230 thermally coupled to the illumination source. In this implementation, upon startup, the system 200: ramps up the duty cycle (e.g., the heat output) of the temperature regulator and implements closed-loop feedback controls to hold the illumination source at a low operating temperature (e.g., 80° C.); and stores an incident photon count (or frequency of incident photons, etc.) recorded by the calibration pixel over a sampling period while the illumination source is held at the low operating temperature. The system 200 then steps up the duty cycle of the temperature regulator to achieve discrete temperature steps (e.g., 0.5° C. steps) from the low operating temperature to a high operating temperature (e.g., 85° C.) at the illumination source; and stores an incident photon count recorded by the calibration pixel over a sampling period each temperature step within the operating temperature range. (The system 200 can also read incident photon counts from the calibration pixel over multiple sampling periods per temperature step and record a median or average photon count for the temperature step.) In this implementation, the system 200 can then identify a peak incident photon count read from the calibration pixel across the set of temperature steps, set a corresponding temperature of the illumination source as an initial target operating temperature, and adjust the duty cycle of the temperature regulator to achieve the initial target operating temperature.

In the foregoing implementation, throughout continued operation, the system can: read incident photon counts from the calibration pixel; detect variations in the incident photon count read by the calibration pixel, such as beyond a threshold variance (e.g., 5%); and modify the output of the temperature regulator accordingly. The system can also: read the temperature of the illumination source from the temperature sensor at corresponding sampling periods; and determine whether to increase or decrease the duty cycle of the temperature regulator responsive to changes in the incident photon count on the calibration pixel based on changes in the temperature of the illumination optic. For example, if the incident photon count recorded by the calibration pixel drops across two or more sampling periods and the temperature sensor indicates that the temperature of the illumination source has also dropped, the system can increase the heat output of the temperature regulator and store temperatures of the illumination source as the incident photon count recorded by the configuration pixel increases. As the incident photon count reaches a peak value and then begins to decrease with increasing temperature of the illumination source, the system can identify a new target operating temperature of the illumination source corresponding to a peak incident photon count recorded by the calibration pixel during the temperature ramp and then reduce the output of the temperature regulator to achieve this new target operating temperature.

In another example, if the incident photon count recorded by the calibration pixel drops over two or more sampling periods and the temperature sensor indicates that the temperature of the illumination source increased over the same sampling periods, the system can reduce the heat output of the temperature regulator and store temperatures of the illumination source as the incident photon count recorded by the calibration pixel increases. As the recorded incident photon count reaches a peak value and then begins to decrease with decreasing temperature of the illumination source, the system can identify a new target operating temperature corresponding to a peak incident photon count recorded by the calibration pixel during the temperature drop and increase the output of the temperature regulator to achieve this new target operating temperature.

In yet another example, if the incident photon count recorded by the calibration pixel drops beyond the threshold variation over two or more sampling periods but no substantial temperature change is detected at the illumination source over the sampling periods, the system can ramp up the heat output of the temperature regulator to achieve a one-step increase in temperature of the illumination source. If the incident photon count recorded by the calibration pixel increases in response to the increase in temperature of the illumination source, the system can: continue to increase the output of the temperature regulator until the incident photon begins to drop, determine a new (higher) target operating temperature corresponding to the new peak incident photon count recorded by the calibration pixel during this temperature ramp; and reduce the output of the temperature regulator to achieve this new target operating temperature, as in the foregoing example. However, if the incident photon count recorded by the calibration pixel decreases in response to the increase in temperature of the illumination source, the system can step down the heat output of the temperature regulator. As the incident photon count increases and then begins to decrease with the decrease in temperature of the illumination source, the system can: determine a new (lower) target operating temperature corresponding to a peak incident photon count recorded by the calibration pixel during this temperature drop; and increase the output of the temperature regulator to achieve this new target operating temperature, as in the foregoing example.

The system can therefore implement closed-loop feedback techniques to achieve an output of the temperature regulator that maintains the illumination source at a temperature corresponding to a center (or primary) output wavelength of the illumination source substantially matched to the effective operating wavelength of the sensing circuit based on a number of photons (or a frequency of photons, a time between consecutive photons, etc.) detected by the single calibration pixel.

In other implementations, the system can vary the output wavelength of the illumination source by: actively tuning an internal Fabrey-Perot cavity thickness in a laser, such as via a MEMS actuator or piezoelectric film within the cavity; actively tuning an external cavity length of a vertical external-cavity surface-emitting laser ("VECSEL"), such as with MEMS actuators. In still other implementations, the system can vary the transmit wavelength (e.g., passband center wavelength) of the receiver circuit by: actively tuning a center wavelength of a filter within the receiver circuit by angle tuning, such as by rotating the filter with a MEMS gimbal actuator; etc. Of course, in some embodiments, the system can vary the output wavelength of the illumination source as discussed above in addition to varying the transmit wavelength of the receiver circuit. In the foregoing implementations, the system can implement closed-loop methods and techniques to actively and dynamically tune the output wavelength of the illumination source and/or the receiver circuit, as described herein.

7. Extended One-Dimensional Calibration Circuit

One variation of the system is illustrated in FIGS. 3A AND 3B as system 300. In this embodiment, system 300 includes a set of (e.g., four) calibration circuits per illumination optic, such as 330-0, 330-1, 330-2, 330-3. In this variation: calibration apertures (e.g., 325-0, 325-1, etc.) in the set of calibration circuits can be formed into the aperture layer at substantially the same time and with substantially the same positional accuracy as the sense aperture; calibration lenses in the set of calibration circuits can be formed into the lens layer at substantially the same time and with substantially the same positional accuracy as the sense lens; and calibration pixels in the set of calibration circuits can be incorporated into the pixel layer at substantially the same time and with substantially the same positional accuracy as the sense pixel, such as according to the methods and techniques described above. The optical filter can also define a singular or unitary structure that spans the set of calibration circuits and the sensing circuit, and the aperture layer, the lens layer, the optical filter, and the pixel layer—including both the calibration and sensing circuits—can be assembled as described above. Furthermore, in this variation, the optical bypass can siphon light from the illumination source into each calibration aperture in the set of calibration circuits, as shown in FIGS. 3A and 3B.

In this variation, calibration lenses can be positioned in the lens layer such that, when the aperture layer is assembled over the lens layer, select calibration aperture and calibration lens pairs are laterally and/or longitudinally offset. Because a particular calibration lens in the set of calibration circuits is thus deliberately offset from its paired calibration aperture in the assembly, the particular calibration lens can pass light—received from the aperture—toward the optical filter at a corresponding off-axis angle. In one example of a nominal assembly (i.e., an assembly in which a first calibration aperture and first calibration lens are axially aligned) including four calibration circuits: the first calibration lens can be axially aligned with the first aperture to output light toward the optical filter at an angle of 0° from normal to the optical filter; a second calibration lens can be laterally offset from a second aperture by a first distance in order to output light toward the optical filter at an angle of 1° from normal to the optical filter; a third calibration lens can be laterally offset from a third aperture by a second distance greater than the first distance in order to output light toward the optical filter at an angle of 2° from normal to the optical filter; and a fourth calibration lens can be laterally offset from a fourth aperture by a third distance greater than the second distance in order to output light toward the optical filter at an angle of 3° from normal to the optical filter, as shown in FIGS. 2A and 2C.

In this variation, the system can execute a method for calibrating an optical distance sensor, including: calculating a first photon count of photons detected by a first calibration pixel axially aligned with a first calibration lens axially aligned with a first calibration aperture; calculating a second photon count of photons detected by a second calibration pixel axially offset from a second calibration lens axially offset from a second calibration aperture by a first offset distance; transforming the first photon count and the second photon count into a target temperature change at an illumination source; and actuating a temperature regulator coupled to the illumination source according to the target temperature change.

In particular, during operation, the system can read incident photon counts (or times between consecutive incident photons, etc.) from each calibration pixel, characterize a difference between the effective operating wavelength of the calibration circuit and the center (or primary) output wavelength of the illumination source during a sampling period based on a pattern of incident photon counts read from the calibration pixels, and then maintain, increase, or decrease the output of the temperature regulator accordingly, as shown in FIG. 2C. In one implementation, if the first calibration circuit records an incident photon count greater than incident photon counts recorded by the other calibration circuits in the system, the system can determine that the center output wavelength of the illumination source is either matched to or is greater than the effective operating wavelength of the first calibration circuit. The system can then determine that the output wavelength of the illumination source is too low if the incident photon count (or the incident photon frequency, etc.) recorded by the first calibration pixel is less than a present threshold value, if the incident photon count recorded by the fourth calibration pixel is less than a present threshold value, or if a difference or ratio between the incident photon counts read by the first and second calibration pixels is less than a preset threshold value, etc. and decrease the heat output of the temperature regulator accordingly, thereby decreasing the output wavelength of the illumination source. However, in this implementation, if the second calibration circuit records an incident photon count greater than the incident photon counts recorded by the other calibration circuits in the system, including the first calibration circuit, the system can determine that the center output wavelength of the illumination source is less than the effective operating wavelength of the first calibration circuit and increase the heat output of the temperature regulator at a first rate accordingly, thereby increasing the output wavelength of the illumination source. Furthermore, in this implementation, if the third calibration circuit records an incident photon count greater than the incident photon counts recorded by the other calibration circuits in the system, including the first and second calibration circuits, the system can determine that the center output wavelength of the illumination source is again less than the effective operating wavelength of the first calibration circuit and increase the heat output of the temperature regulator at a second rate greater than the first rate accordingly, thereby more rapidly increasing the output wavelength of the illumination source.

The system can therefore actively adjust the output of the temperature regulator substantially in real-time based on incident photon counts recorded by the calibration pixels throughout operation.

Alternatively, the system can locally store a set of photon count templates (or lookup tables, etc.), wherein each photon count template includes absolute or relative incident photon count values for the set of calibration circuits at a particular absolute or relative difference between the effective operating wavelength of the sensing circuit and the center (or primary) output wavelength of the illumination source. The system can thus implement template matching techniques to match a set of incident photon counts recorded by the set of calibration pixels during a sampling period to a particular photon count template in the set of photon count templates and then modify the heat output of the illumination source accordingly, such as based on a heat output change target associated with the matched photon count template. However, the system can implement any other method or technique to transform incident photon counts read by the set of calibration circuits during a sampling period into a new heat output target for the illumination source. The system can repeat this process for each sampling period (or each set of consecutive sampling periods) throughout operation to maintain alignment between the center output wavelength of the illumination source and effective operating wavelength of the sensing circuit.

8. Defect Compensation in Extended Calibration Circuit

In another example of the system that includes four calibration circuits realizing different light output angles at the optical filter, the lens layer can be misaligned with the aperture layer due to manufacturing defects or manufacturing limitations such that: the first calibration lens is offset from the first aperture by a first distance and thus outputs light toward the optical filter at an angle of −1° from normal to the optical filter; the second calibration lens is substantially axially aligned with the second aperture and thus outputs light toward the optical filter at an angle of 0° from normal to the optical filter; the third calibration lens is laterally offset from the third aperture by the first distance and thus outputs light toward the optical filter at an angle of 1° from normal to the optical filter; and the fourth calibration lens is laterally offset from the fourth aperture by a second distance greater than the first distance and thus outputs light toward the optical filter at an angle of 2° from normal to the optical filter, as shown in FIG. 2D. In this example, the system can implement methods and techniques described above to adjust the heat output of the illumination source in order to substantially maximize the incident photon count (or incident photon frequency, etc.) recorded by the first calibration pixel per unit time. As described above, if the first and third calibration circuits record substantially similar incident photon counts that are also greater than incident photon counts recorded by the second and fourth calibration circuits, the system can determine that the center output wavelength of the illumination source is either matched to or is greater than the effective operating wavelength of the first calibration circuit, as shown in FIG. 2D. The system can then determine that the output wavelength of the illumination source is too low if the incident photon count (or the incident photon frequency, etc.) recorded by the first calibration pixel is less than a present threshold value or if a difference (or if a ratio between incident photon counts read by the first and second calibration pixels is less than a preset threshold value, etc.) and decrease the heat output of the temperature regulator accordingly, thereby decreasing the output wavelength of the illumination source. However, in this implementation, if the fourth calibration circuit records an incident photon count greater than the incident photon counts recorded by the other calibration circuits in the system, the system can determine that the center output wavelength of the illumination source is less than the effective operating wavelength of the first calibration circuit and can increase the heat output of the temperature regulator accordingly, as shown in FIG. 2D, thereby increasing the output wavelength of the illumination source. Alternatively, the system can implement template matching techniques to match incident photon counts recorded by the set of calibration pixels during a sampling period to a photon count template and modify the heat output of the temperature regulator accordingly, as described above.

In a similar example in which the lens layer is misaligned with the aperture layer: the first calibration lens is offset from the first aperture by a first distance and thus outputs light toward the optical filter at an angle of −0.5° from normal to the optical filter; the second calibration lens is offset from the second aperture by the first distance and thus outputs light toward the optical filter at an angle of 0.5° from normal to the optical filter; the third calibration lens is laterally offset from the third aperture by a second distance greater than the first distance and thus outputs light toward the optical filter at an angle of 1.5° from normal to the optical filter; and the fourth calibration lens is laterally offset from the fourth aperture by a third distance greater than the second distance and thus outputs light toward the optical filter at an angle of 2.5° from normal to the optical filter.

In another example, the system performs an initial calibration by: scanning the illumination source across a range of output wavelengths (e.g., by varying the temperature of the illumination source across an operating range); recording incident photon counts per unit time across the set of calibration pixels in a calibration template for various output wavelengths of the illumination source during the scan (or at each discrete temperature of the illumination source during the scan); recording incident photon counts per unit time across the sense pixels for various output wavelength of the illumination source during the scan; identifying a particular illumination source wavelength (or temperature) yielding a highest incident photon counts per unit time across the sense pixels; and setting a particular calibration template—corresponding to the particular illumination source wavelength—from the scan as a target calibration template. Later, during operation, the system can vary the output wavelength of the illumination source (e.g., by varying the temperature of the illumination source) to match incident photon counts per unit time across the set of calibration pixels to the target calibration template.

However, the calibration apertures and calibration lenses can be nominally offset according to any other schema and can be offset in any other way due to manufacturing defects, manufacturing limitations, etc. The system can also implement any other method or technique to characterize alignment between the effective operating wavelength of the calibration circuit—and therefore the sensing circuit—and the illumination source and to modify the heat output of the temperature regulator accordingly.

9. Extended Two-Dimensional Calibration Circuit

In another implementation, the system includes calibration circuits arranged along multiple axes. For example, the system can include: a first calibration circuit arranged at an origin position and configured to pass light toward the optical filter at an angle of 0° in a nominal system assembly; a second calibration circuit laterally offset (e.g., offset along an X-axis) from the first calibration circuit and configured to pass light toward the optical filter at an angle of 1° in the nominal system assembly; a third calibration circuit laterally offset from the second calibration circuit and configured to pass light toward the optical filter at an angle of 2° in the nominal system assembly; a fourth calibration circuit longitudinally offset (e.g., offset along a Y-axis) from the first calibration circuit and configured to pass light toward the optical filter at an angle of 1° in the nominal system assembly; and a fifth calibration circuit longitudinally offset from the third calibration circuit and configured to pass light toward the optical filter at an angle of 2° in the nominal system assembly. This two-dimensional array of calibration circuits can thus collect incident photon data symptomatic of both a lateral offset and longitudinal offset of the lens layer relative to the aperture layer, and the system can modify the heat output of the temperature regulator based on absolute or relative differences between incident photon counts recorded across the five calibration pixels, such as according to methods and techniques described above, in order to align the center output wavelength of the illumination source to the effective operating wavelength of the sensing circuit, thereby compensating for both the lateral offset and the longitudinal offset of the lens layer relative to the aperture layer.

10. Multiple Illumination Sources

In one variation, the system further includes multiple discrete illumination sources. In this variation, each illumination source is paired with: one discrete bulk transmitting optic; a calibration circuit (or set of calibration circuits) integrated into the aperture layer, lens layer, the optical filter, and the pixel layer; and an optical bypass interposed between the illumination source and the calibration aperture(s) of the corresponding calibration circuit(s). For example, the system can include: a first bulk transmitting optic and a second bulk transmitting optic on opposing longitudinal sides of the bulk receiving optic; a first illumination optic behind the first bulk transmitting optic; and a second illumination optic behind the second bulk transmitting optic. In this example, each illumination source and its corresponding bulk transmitting optic can project a set of illuminating beams into the fields of view of corresponding sensing circuits in the system, thereby achieving twice the illumination power per field of view of the sensing circuits compared to a system with a single like illumination source.

However, in this variation, various illumination sources in the system may exhibit differences in their outputs during operation, such as different center output wavelengths for a particular operating temperature and/or different changes in center output wavelength per change in operating temperature. The system can therefore include a discrete optical bypass and calibration circuit(s) per illumination source. In particular, in the foregoing example, the system can include a first optical bypass extending from the first illumination source to a first calibration aperture over a first longitudinal side of the aperture layer; a second optical bypass extending from the second illumination source to a second calibration aperture over a second longitudinal side of the aperture layer opposite the first side of the aperture layer; a first temperature regulator thermally coupled to the first illumination source; and a second temperature regulator thermally coupled to the second illumination source and controlled independently of the first temperature regulator. The system can thus implement the foregoing methods and techniques to match the center output wavelength of the first illumination source to the effective operating wavelength of its corresponding calibration circuit independently of the second illumination source; and vice versa.

However, in this variation, the system can include any other number and configuration of illumination sources, bulk transmitting optics, optical bypasses, temperature regulators, and calibration circuits in order to illuminate fields of view defined by the sensing circuits and to match the output wavelength of each illumination source to the effective operating wavelength of the sensing circuits.

The systems and methods described herein can be embodied and/or implemented at least in part as a machine configured to receive a computer-readable medium storing computer-readable instructions. The instructions can be executed by computer-executable components integrated with the application, applet, host, server, network, website, communication service, communication interface, hardware/firmware/software elements of a user computer or mobile device, wristband, smartphone, or any suitable combination thereof. Other systems and methods of the embodiment can be embodied and/or implemented at least in part as a machine configured to receive a computer-readable medium storing computer-readable instructions. The instructions can be executed by computer-executable components integrated by computer-executable components integrated with apparatuses and networks of the type described above. The computer-readable medium can be stored on any suitable computer readable media such as RAMs, ROMs, flash memory, EEPROMs, optical devices (CD or DVD), hard drives, floppy drives, or any suitable device. The computer-executable component can be a processor but any suitable dedicated hardware device can (alternatively or additionally) execute the instructions.

As a person skilled in the art will recognize from the previous detailed description and from the figures and claims, modifications and changes can be made to the embodiments of the invention without departing from the scope of this invention as defined in the following claims.

What is claimed is:

1. An optical system for performing distance measurements, the optical system comprising:
    an optical imaging receive module comprising a bulk receiver optic, an aperture layer including a plurality of apertures, a lens layer including a plurality of lenses and a pixel layer including a plurality of sense pixels, a plurality of sensor channels and at least one calibration channel, wherein each sensor channel in the plurality of sensor channels and the at least one calibration channel includes an aperture from the plurality of apertures, a lens from the plurality of lenses and a sense pixel from the plurality of sense pixels, and wherein each sensor channel in the plurality of sensor channels defines a different, discrete field of view in a field ahead of the optical system; and
    an optical imaging transmit module comprising a bulk transmitter optic and an illumination source comprising a plurality of optical emitters configured to output light at an operating wavelength as a function of a parameter, project a first portion of the light into a field ahead of the optical system according to an illumination pattern that substantially matches, in size and geometry across a range of distances from the system, the fields of view of the plurality of sensor channels, and project a second portion of the light onto the sense pixel in the calibration channel; and
    a regulator configured to modify the parameter of the plurality of optical emitters based on a light power detected by the sense pixel in the calibration channel.

2. The optical system for performing distance measurements set forth in claim 1 wherein for each sensor channel in the plurality of sensor channels there is a corresponding optical emitter from the plurality of optical emitters that illuminates substantially only surfaces in the field ahead of the optical system that are within the field of view of the sensor channel.

3. The optical system for performing distance measurements set forth in claim 2 wherein each discrete field of view is non-overlapping beyond a threshold distance from the optical system.

4. The optical system for performing distance measurements set forth in claim 1 further comprising an optical filter disposed between the plurality of lenses and the plurality of sense pixels, the optical filter configured to receive light from the plurality of lenses and pass light to the plurality of sense pixels at a narrow band of wavelengths that includes the operating wavelength while blocking light outside the narrow band.

5. The optical system for performing distance measurements set forth in claim 1 wherein the regulator is configured to modify a temperature of each emitter in the plurality of optical emitters.

6. The optical system for performing distance measurements set forth in claim 5 wherein each sense pixel in the plurality of sense pixels comprises an array of single-photon avalanche detectors (SPADs) and each optical emitter in the plurality of optical emitters comprises a vertical-cavity surface-emitting laser (VCSEL).

7. The optical system for performing distance measurements set forth in claim 6 wherein the regulator is configured to actively tune an external cavity length of the VCSELs.

8. The optical system for performing distance measurements set forth in claim 1 wherein the plurality of optical emitters includes a first set of optical emitters configured to project a plurality of discrete illuminating beams through the bulk transmitter optic and a second optical emitter configured to project a discrete illuminating beam onto the sense pixel in the calibration channel, wherein each of the optical emitters in the first set of optical emitters and the second optical emitter exhibit substantially similar output wavelength characteristics as a function of temperature.

9. The optical system for performing distance measurements set forth in claim 8 further comprising an optical bypass extending from the second optical emitter to the at least one calibration channel, the optical bypass configured to direct the discrete illuminating beam projected by the second optical emitter to the calibration channel.

10. An optical system for performing distance measurements, the optical system comprising:
an optical imaging receive module comprising a bulk receiver optic configured to project incident light rays from outside the system toward a focal plane within the optical imaging receive module, an aperture layer coincident with the focal plane and including a plurality of apertures extending through the aperture layer surrounded by a stop region, a lens layer including a plurality of lenses, a pixel layer including a plurality of sense pixels, an optical filter disposed between the plurality of lenses and the plurality of sense pixels, a plurality of sensor channels and at least one calibration channel, wherein each sensor channel in the plurality of sensor channels and the at least one calibration channel includes an aperture from the plurality of apertures, a lens from the plurality of lenses and a sense pixel from the plurality of sense pixels, and wherein each sensor channel in the plurality of sensor channels defines a discrete field of view in a field ahead of the optical imaging receive module that is non-overlapping beyond a threshold distance from the optical system and wherein each sensor channel in the plurality of sensor channels is configured to communicate light incident from the bulk receiver optic to the sense pixel of the sensor channel through the lens of the sensor channel and through the optical filter; and
an optical imaging transmit module comprising a bulk transmitter optic and an illumination source comprising a plurality of optical emitters configured to output light at an operating wavelength as a function of a parameter, project a first portion of the light into a field ahead of the system and project a second portion of the light onto the sense pixel in the calibration channel; and
a temperature regulator configured to modify a temperature of the light output by the plurality of optical emitters based on a light power detected by the sense pixel in the calibration channel.

11. The optical system for performing distance measurements set forth in claim 10 wherein each sense pixel in the plurality of sense pixels comprises an array of single-photon avalanche detectors (SPADs), each optical emitter in the plurality of optical emitters comprises a vertical-cavity surface-emitting laser (VCSEL), and the temperature regulator is configured to actively tune an external cavity length of the VCSELs.

12. The optical system for performing distance measurements set forth in claim 11 wherein stop region of the aperture layer rejects incident light rays and, for each sensor channel, the aperture of the channel passes incident light rays towards the sense pixel of the channel through the optical filter, and wherein the optical filter is configured to pass light to the sense pixel at a narrow band of wavelengths that includes the operating wavelength while blocking light outside the narrow band.

13. The optical system for performing distance measurements set forth in claim 12 wherein the optical system can scan a volume to collect three-dimensional distance data that can be reconstructed into a virtual three-dimensional representation of the volume.

14. An optical system for performing distance measurements, the optical system comprising:
an optical imaging receive module comprising a bulk receiver optic, an aperture layer coincident with the focal plane and including a plurality of apertures extending through the aperture layer surrounded by a stop region, a lens layer including a plurality of lenses and a pixel layer including a plurality of sense pixels, a plurality of sensor channels and at least one calibration channel, wherein each sensor channel in the plurality of sensor channels and the at least one calibration channel includes an aperture from the plurality of apertures, a lens from the plurality of lenses and a sense pixel from the plurality of sense pixels; and
an optical imaging transmit module comprising a bulk transmitter optic and an illumination source comprising a plurality of optical emitters configured to output a band of wavelengths as a function of a parameter, the plurality of optical emitters including a first set of optical emitters configured to project a discrete illuminating beam through the bulk transmitter optic and a second optical emitter, wherein each of the optical emitters in the first set of optical emitters and the second optical emitter exhibit substantially similar output wavelength characteristics as a function of temperature;
an optical bypass extending from the second optical emitter to the at least one calibration channel, the optical bypass configured to direct a discrete beam projected by the second optical emitter to the calibration channel; and a regulator configured to modify the parameter of the plurality of optical emitters based on a light power detected by the sense pixel in the calibration channel.

15. The optical system for performing distance measurements set forth in claim 14 wherein each sensor channel in the plurality of sensor channels defines a discrete field of view in a field ahead of the optical imaging receive module.

16. The optical system for performing distance measurements set forth in claim 15 wherein each discrete field of view is non-overlapping beyond a threshold distance from the optical system.

17. The optical system for performing distance measurements set forth in claim 14 further comprising an optical filter disposed between the plurality of lenses and the plurality of sense pixels, the optical filter configured to receive light from the plurality of lenses and pass light at an operating wavelength to the plurality of sense pixels.

18. The optical system for performing distance measurements set forth in claim 14 wherein the regulator is configured to modify a temperature of each emitter in the plurality of emitters.

19. The optical system for performing distance measurements set forth in claim 18 wherein each sense pixel in the plurality of sense pixels comprises an array of single-photon avalanche detectors (SPADs) and each optical emitter in the plurality of optical emitters comprises a vertical-cavity surface-emitting laser (VCSEL).

20. The optical system for performing distance measurements set forth in claim 19 wherein the regulator is configured to actively tune an external cavity length of the VCSELs.

21. An optical system for performing distance measurements, the optical system comprising:
an optical input circuit comprising: a bulk receiving optic; a pixel layer arranged behind the bulk receiving optic and comprising a plurality of pixels; an aperture layer disposed between the plurality of pixels and the bulk receiving optic and comprising a plurality of apertures; a lens layer disposed between the plurality of pixels and the bulk receiving optic and comprising a plurality of lenses; a filter layer disposed between the plurality of pixels and the bulk receiving optic; wherein the pixel layer, aperture layer, lens layer and filter layer are arranged to form:
a plurality of sense channels, each sense channel in the plurality of sense channels comprising an aperture from the plurality of apertures that defines a discrete, non-overlapping beyond a threshold distance field of view in a field ahead of the optical system, a lens from the plurality of lenses, a filter element from the filter layer and a pixel from the plurality of pixels; and
a calibration channel having a primary operating wavelength and comprising an aperture from the plurality of apertures, a lens from the plurality of lenses, a filter element from the filter layer and a pixel from the plurality of pixels;
an optical output circuit comprising a bulk transmitting optic and an illumination source offset behind the bulk transmitting optic, the illumination source comprising a plurality of lasers configured to output light at an output wavelength, project a first portion of the light into the field ahead of the optical system according to an illumination pattern that substantially matches, in size and geometry across a range of distances from the system, the fields of view of the plurality of sense apertures, and project a second portion of the light onto the pixel in the calibration channel; and
a temperature regulator operatively coupled to the illumination source to shift the output wavelength of the plurality of lasers based on a light power detected by the pixel in the calibration channel to the primary operating wavelength of the calibration circuit.

22. The optical system for performing distance measurements set forth in claim 21 wherein the plurality of lasers is fabricated on a single chip and exhibit substantially similar output wavelength characteristics as a function of temperature.

23. The optical system for performing distance measurements set forth in claim 21 wherein the plurality of lasers are arranged in an array characterized by an emitter pitch distance substantially identical to a sense aperture pitch distance.

24. The optical system for performing distance measurements set forth in claim 21 wherein the bulk receiver optic and the bulk transmitter optic are disposed within a common housing and arranged in plane and laterally offset from each other.

25. The optical system for performing distance measurements set forth in claim 21 wherein the system is configured to function as an image sensor that, when rotated about an axis parallel to a column of sense apertures, collects three-dimensional distance data of a volume occupied by the system.

26. The optical system for performing distance measurements set forth in claim 21 wherein the pixel in each sense channel is configured to output a signal or stream of signals corresponding to a count of photons incident on the pixel within a single sampling period and wherein the system further comprises a processor and a computer-readable medium, the processor configured to execute instructions stored in the computer-readable medium to transform incident photon counts and photon timing information with known positions of the fields of view for each sense pixel into a virtual three-dimensional representation of the field external to the system.

27. The optical system for performing distance measurements set forth in claim 21 wherein the pixel in each sense channel comprises a plurality of single-photon avalanche diode detectors (SPADs) and each laser in the plurality of lasers comprises a vertical cavity surface emitting laser (VCSEL).

* * * * *